(12) United States Patent
Albon et al.

(10) Patent No.: US 6,683,509 B2
(45) Date of Patent: Jan. 27, 2004

(54) VOLTAGE CONTROLLED OSCILLATORS

(75) Inventors: Richard Albon, Tavistock (GB); David John Johnston, Tavistock (GB)

(73) Assignee: Zarlink Semiconductor Limited (GB)

( * ) Notice: Subject to any disclaimer, the term of this patent is extended or adjusted under 35 U.S.C. 154(b) by 0 days.

(21) Appl. No.: 10/223,869

(22) Filed: Aug. 20, 2002

(65) Prior Publication Data

US 2003/0048145 A1 Mar. 13, 2003

(30) Foreign Application Priority Data

Aug. 21, 2001 (GB) .............................. 0120269

(51) Int. Cl.⁷ ................................. H03B 1/00
(52) U.S. Cl. ................................... 331/177 V
(58) Field of Search .............................. 331/117 R, 16, 331/117 FE, 177 V; 327/156, 103

(56) References Cited

U.S. PATENT DOCUMENTS

| | | | |
|---|---|---|---|
| 4,503,401 A | 3/1985 | Kyriakos et al. ............. 331/16 |
| 4,990,866 A | 2/1991 | Martheli ....................... 337/99 |
| 5,182,528 A | 1/1993 | Zuta ............................ 331/1 A |
| 6,137,372 A | 10/2000 | Welland ................... 331/117 R |
| 6,433,837 B1 * | 8/2002 | Salle et al. .................... 331/20 |
| 6,556,093 B2 * | 4/2003 | Craninckx et al. ...... 331/117 R |
| 2001/0013812 A1 | 8/2001 | Cunning |
| 2001/0038315 A1 | 11/2001 | Memmler et al. |

* cited by examiner

Primary Examiner—Dinh T. Le
(74) Attorney, Agent, or Firm—Thompson Hine LLP

(57) ABSTRACT

A frequency synthesiser comprises a voltage controlled oscillator, VCO, having means for fine tuning the oscillator frequency and switchable capacitive elements for coarse tuning the oscillator frequency. First comparison means are provided for comparing the frequency and phase of the output of the VCO or a signal derived therefrom with that of a reference frequency signal to provide an error signal, the error signal being provided to said means for fine tuning the oscillator frequency. Second comparison means are provided for comparing the error signal against one or more reference values and a control means receives the result of the comparison from the second comparison means and switches said switchable capacitive elements on and off in dependence upon the result so as to coarse tune the oscillator frequency.

10 Claims, 5 Drawing Sheets

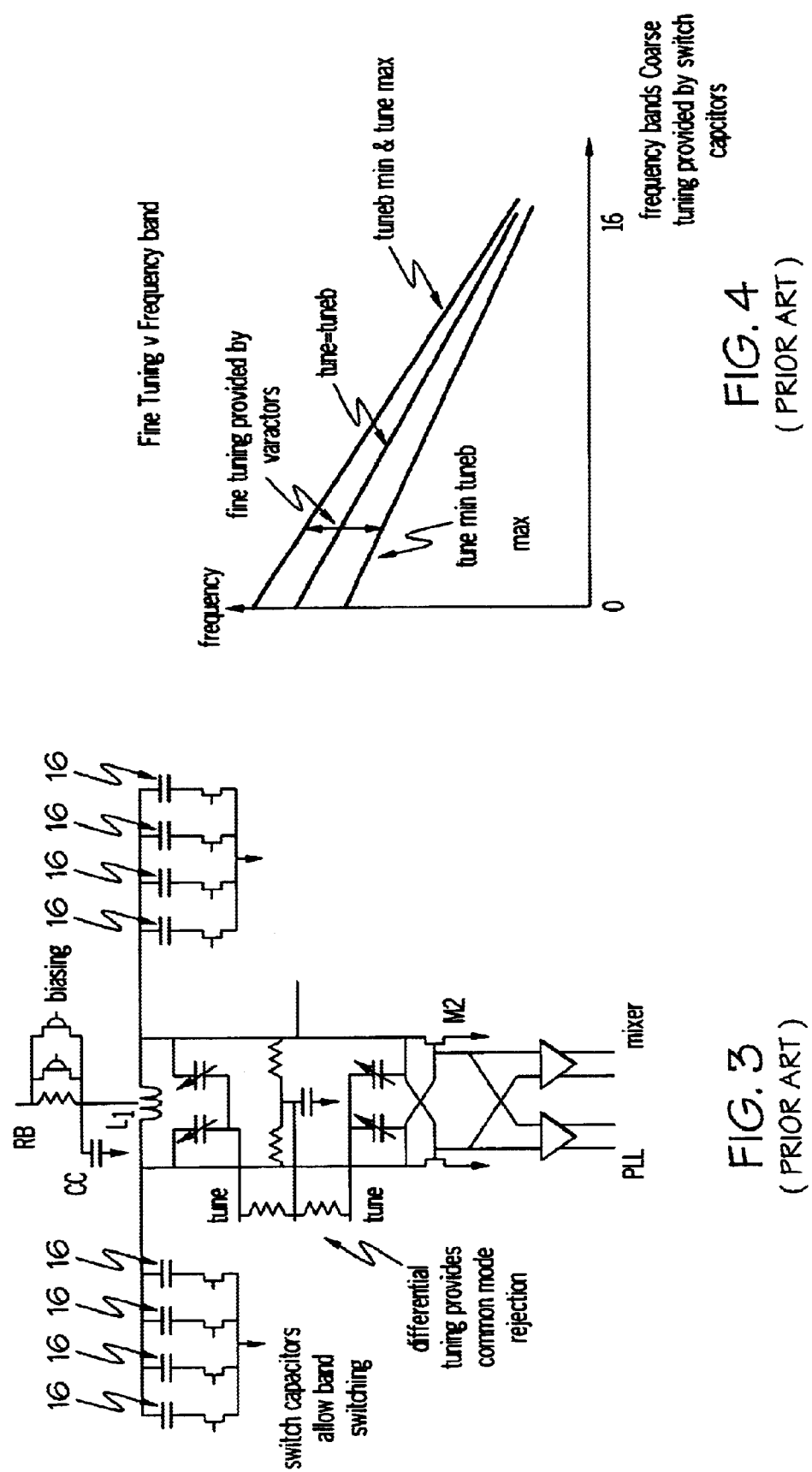

VOLTAGE CONTROLLED OSCILLATORS

FIELD OF THE INVENTION

The present invention relates to voltage controlled oscillators and to a method and circuit for controlling voltage controlled oscillators.

BACKGROUND

The voltage controlled oscillator (VCO) is a key element in successful broadband receivers, particularly in the receiver front end where noise can have a dramatic effect upon the quality of a broadband signal coming from an antenna or digital TV cable. Careful VCO design is needed to cope with tuning over a wide range of frequencies for broadband requirements.

Radio frequency (RF) circuits have traditionally been implemented using integrated bipolar technology with external passive components. More recently however, RF circuits implemented using CMOS technology have been shown to provide significant cost savings compared to bipolar technologies. FIG. 1 illustrates a basic VCO design using a pair of CMOS MOSFET transistors M1 and M2 and a pair of varactor fine tuning elements CV1 and CV2. The varactors and fine tuning capacitors combine with the fixed value inductor L1 to produce oscillation at a frequency given by:

$$f_o = \tfrac{1}{2} * pi * sqrt(LC)$$

Control of the varactor capacitance and hence the frequency is achieved by varying the voltage applied to the tune "node". FIG. 2 illustrates the relationship between the voltage applied to the tune node, Tune(v), and the VCO oscillating frequency (where the modulation index is the slope in Mhz/v).

So-called accumulation mode MOSFET varactors (AMOS) can achieve a cmax to cmin ratio of 3:1, within the "headroom" allowed by the on-chip supply voltages, and can offer a better Q value than other on-chip MOS devices. One approach to extending the tuning range is to introduce off-chip varactors, effectively removing the voltage headroom limit present on-chip. If off-chip varactors are not desirable, then an alternative approach is to utilise both fine and coarse on-chip tuning elements to extend the tuning range and resolution. FIG. 3 illustrates a CMOS circuit making use of this approach. A series of capacitors are switchable into and out of the VCO circuit, to supplement the oscillator tank, by turning on and off respective switches. FIG. 3 illustrates a circuit comprising four switched capacitors on each side of the tank, allowing up to sixteen channels with each channel having a level of fine tuning provided by the varactors connected to nodes tune and tuneb. The tuning characteristics of the circuit of FIG. 3 are illustrated in FIG. 4.

FIG. 5 illustrates schematically a closed loop synthesiser comprising a VCO. A controller writes an appropriate value to a register coupled to the VCO, the value being selected in dependence upon the frequency to be tuned to. The value held by the register is used to determine which capacitor elements will be switched into the VCO tuning circuit, and hence to provide an initial coarse tuning of the VCO. Inside the synthesiser the VCO output frequency is divided down by a value appropriate to the required frequency and compared to a reference frequency derived from a crystal oscillator source. The result of the comparison is converted into a form which adjusts the fine tuning of the VCO until the frequency and phase at the phase comparator inputs due to the VCO output and the crystal oscillator are identical. At this point a lock signal is generated to indicate locking.

Problems arise with this arrangement when fine tuning of the VCO causes the tuning voltage to go beyond the extremes of the tuning curve (e.g. as shown in FIG. 1). If lock is achieved too close to the extremes of the curve, any drift (due for example to temperature or supply voltage change) may cause loss of lock and an inability to retune.

SUMMARY

According to a first aspect of the present invention there is provided a frequency synthesiser including:

a voltage controlled oscillator, VCO, having means for fine tuning the oscillator frequency and switchable capacitive elements for coarse tuning the oscillator frequency;

first comparison means for comparing the frequency and phase of the output of the VCO or a signal derived therefrom with that of a reference frequency signal to provide an error signal, the error signal being provided to the means for fine tuning the oscillator frequency;

second comparison means for comparing the error signal against one or more reference values; and control means for receiving the result of the comparison from the second comparison means and for switching the switchable capacitive elements on and off in dependence upon the result so as to coarse tune the oscillator frequency.

By integrating control of the switching of the coarse tuning capacitive elements into the feedback control loop of the synthesiser, embodiments of the present invention reduce the risk that frequency lock will be achieved at the extremes of the fine tuning range of the VCO, or that lock cannot be achieved because the locking frequency lies outside of the available tuning range (surrounding the selected coarse tuning frequency). The reference signal or signals correspond to boundaries of the error signal beyond which the fine tuning means will not respond adequately.

Preferably, the means for fine tuning the VCO comprises a pair of varactors. The varactors are each arranged to receive the error signal.

Preferably, the switchable capacitive elements for coarse tuning the oscillator frequency each comprise a capacitor coupled in series with a transistor switch. The control means comprises a register for storing values defining the settings of the switchable capacitive elements (on or off). The register may be written to by a controller to define the initial settings of the capacitive switching elements. The control means may change the values stored in the register in dependence upon the result of the comparison between the error signal and the one or more reference values.

Preferably, the frequency synthesiser comprises a low pass filter for filtering the error signal. The low pass filtered error signal is provided to the first comparison means and to the means for fine tuning the oscillator frequency.

Preferably, the first comparison means is a phase locked loop, PLL.

Preferably, the second comparison means is arranged to compare the error signal against a pair of reference values corresponding to maximum and minimum error signal boundaries, the result indicating whether or not the error signal is greater than the maximum boundary, less than the minimum boundary, or between the maximum and minimum boundaries. In the event that the result indicates that the error is less than the minimum boundary, the control means will increase the capacitance in the VCO tuning circuit by switching on an additional capacitive element. In the event that the result indicates that the error is greater than the maximum boundary, the control means will decrease the capacitance in the VCO tuning circuit by switching off a capacitive element. In the event that the result indicates that the error is between the maximum and minimum boundaries, the settings of the capacitive elements will not be changed.

Preferably, the control means is arranged to act upon the result only after a predefined delay following the switching of one or more capacitive elements. This delay allows the system the stabilise before further tuning is carried out.

Preferably, the first comparison means comprises means for providing a lock signal at an output thereof, to indicate whether or not the frequency and phase of the output of the VCO is locked to that of the reference frequency signal or the derived signal. More preferably, the lock signal is provided to the control means. The control means is arranged to respond to an indication by the lock signal that lock has been achieved, by inhibiting further switching of the switchable capacitive elements.

According to a second aspect of the present invention there is provided a method of controlling a voltage controlled oscillator, VCO, of a frequency synthesiser, the method comprising the steps of:

comparing the output of the VCO or a signal derived therefrom against a reference frequency signal, and providing an error signal indicative of the frequency and phase difference between the two signals;

applying the error signal to control fine tuning varactors of the VCO for fine tuning the oscillator frequency;

comparing the error signal against one or more reference signals to provide a switching signal or signals; and using the switching signal(s) to control switchable capacitive elements for coarse tuning the oscillator frequency.

BRIEF DESCRIPTION OF THE DRAWINGS

FIG. 3 is a circuit diagram of a CMOS voltage controlled oscillator incorporating a set of switchable capacitors;

FIG. 4 illustrates the tuning characteristics of the circuit of FIG. 3;

DETAILED DESCRIPTION OF CERTAIN EMBODIMENTS

Reference has been made above to FIGS. 1 to 5 to illustrate prior art voltage controlled oscillators (VCOs) and VCO control systems.

Figure 6:
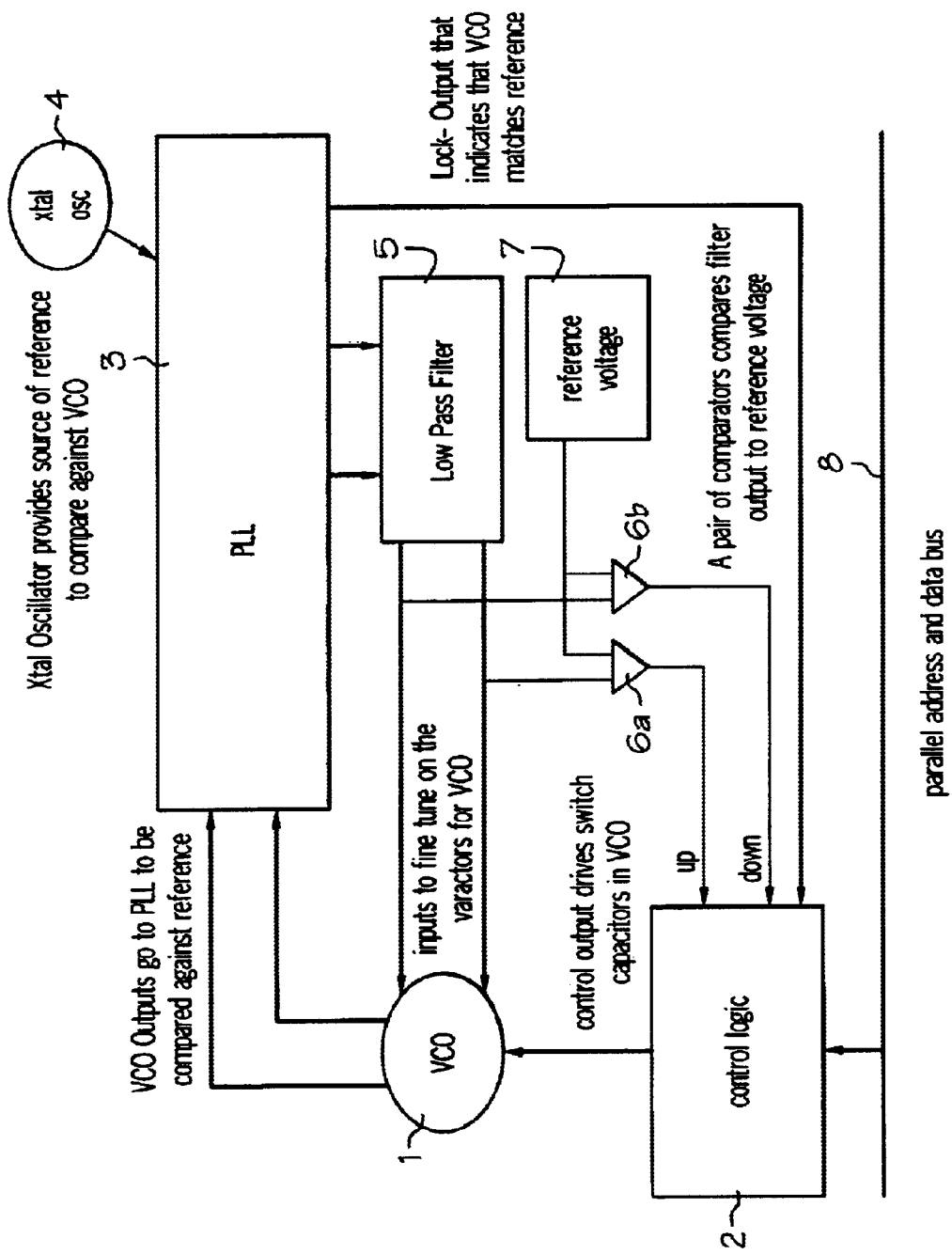
FIG. 6 illustrates schematically a synthesiser according to an embodiment of the present invention.

FIG. 6 illustrates a synthesiser suitable for providing a stable signal of fixed frequency and which may be integrated onto a single chip. Typically, the synthesiser will find use in a broadband receiver such as a satellite or cable television broadcast receiver. The signal generated by the synthesiser is mixed with the received signal in order to isolate a given channel, e.g. selected by a viewer.

A VCO 1 of the synthesiser has an architecture similar to that shown in FIG. 3, with a set of varactors providing for the fine tuning of the oscillator 1. Symmetric sets of capacitive switching elements (each comprising a capacitor and a transistor switch) are provided for coarse tuning the VCO 1. In the example shown in FIG. 3, the two sets of four switching elements provide 16 possible coarse tuning positions. The transistors which switch the tuning elements are controlled by control logic 2. The control logic 2 contains a 4-bit register which holds a value defining the settings of the transistors. The outputs of the register are applied symmetrically to the transistors of the two sets of switching elements so that the elements are turned on or off depending upon the bit values held in the register.

The outputs from the VCO 1 are applied to inputs of a phase locked loop (PLL) 3. The PLL 3 receives at another input a signal generated by a crystal oscillator 4. The VCO signal is frequency divided by the PLL 3 to generate a signal which is compared against the crystal oscillator frequency in terms of phase and frequency. An error signal is generated and is provided at an output of the PLL 3. In the event that the two signals are locked to one another, the PLL 3 provides a lock signal on another output.

The (differential) error signal provided by the PLL 3 is input to a low pass filter 5. The low pass filtered error signal is provided to the control inputs of the fine tuning varactors of the VCO 1. The filtered error signal is also provided to the inputs of a pair of comparators 6a,6b which receive at their second inputs respective reference signals provided by a reference voltage generator 7. The outputs of the comparators 6a,6b are supplied to the control logic 2.

The control logic is coupled to a parallel address and data bus 8 (i2c bus). Following for example the selection of a new channel, a control processor (not shown) places a value on the bus 8 which is loaded into the register of the control logic 2. This value defines the settings of the switchable capacitive elements of the VCO 1 to coarse tune the VCO 1 to the frequency of the selected channel. The new value is also applied to an input of the PLL 1 to set the frequency division circuit thereof. The register value is then applied to the inputs of the two sets of switchable elements to retune the VCO 1.

Figure 2:
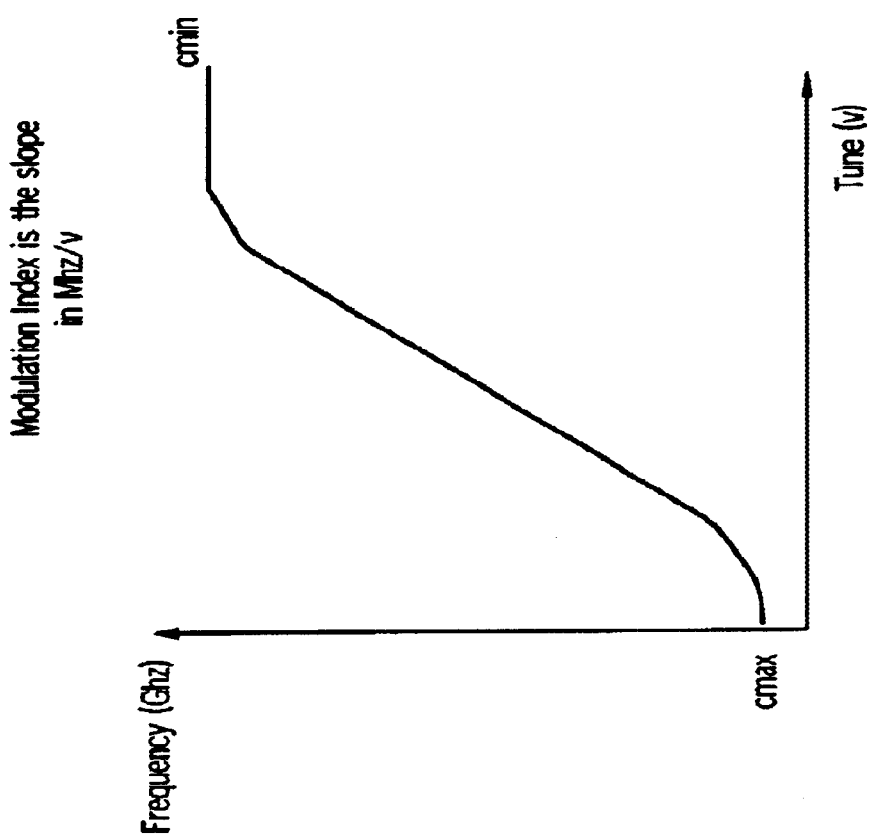
FIG. 2 illustrates the tuning characteristics of the circuit of FIG. 1.
Figure 1:
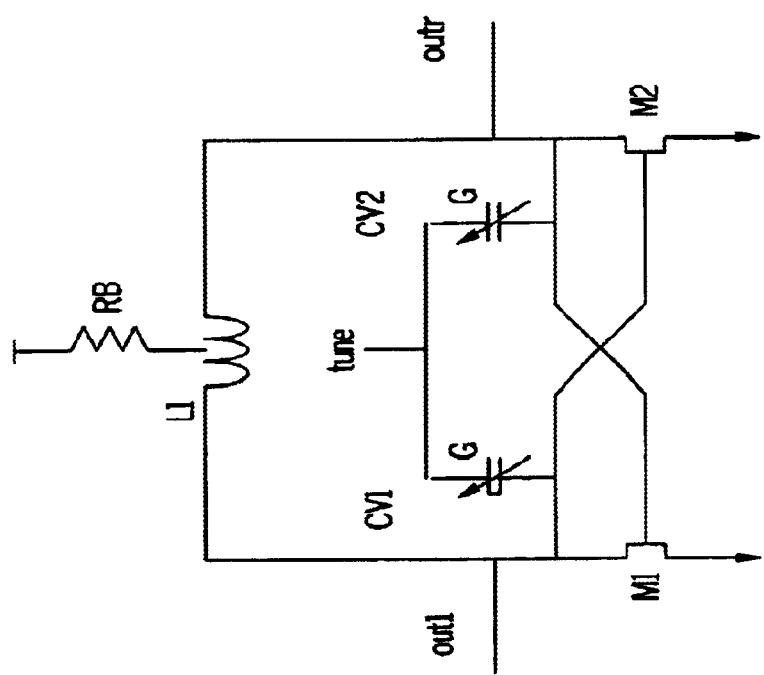
FIG. 1 is a circuit diagram of a simple CMOS voltage controlled oscillator.
Figure 5:
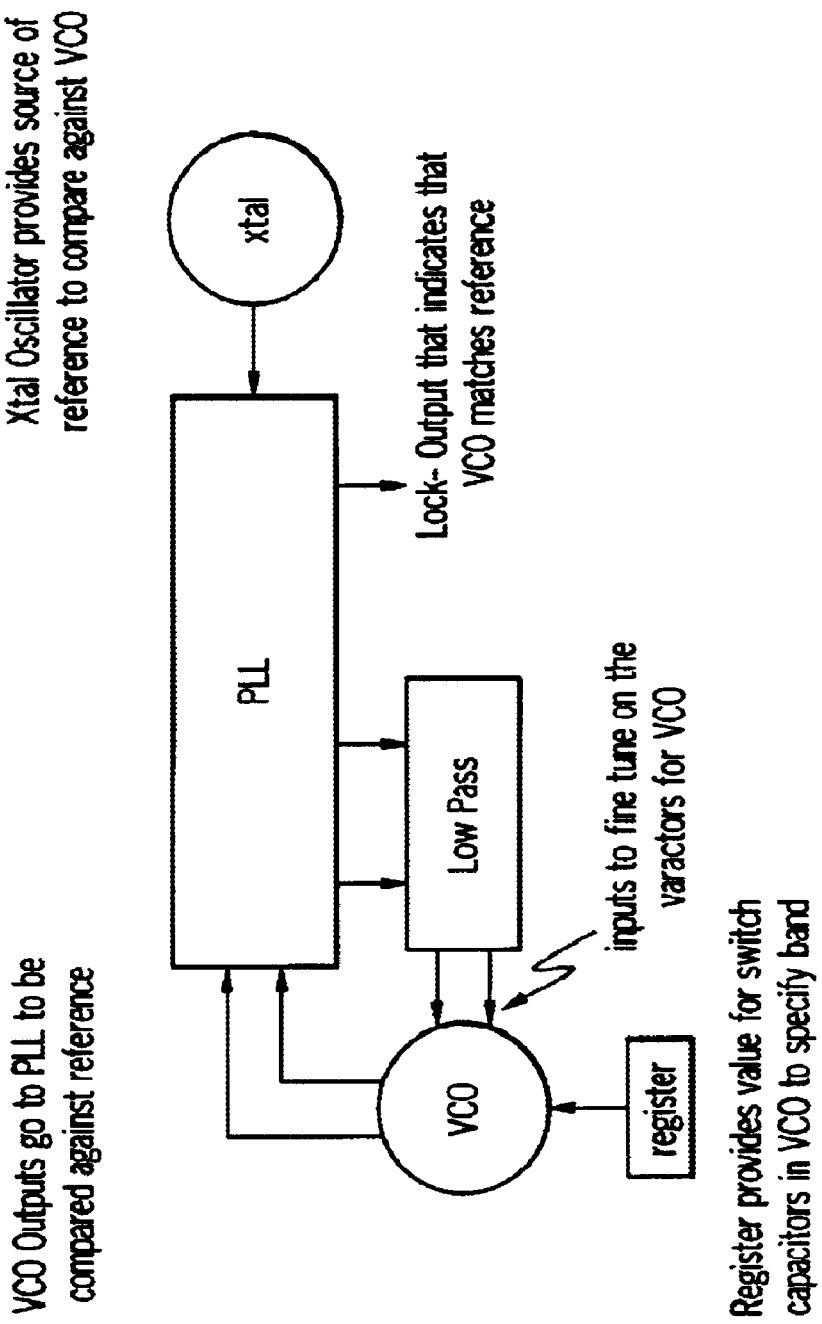
FIG. 5 illustrates schematically a synthesiser comprising a voltage controlled oscillator and a phase locked loop.

The PLL 3 will then generate an error signal corresponding to the phase and frequency difference between the divided VCO signal and the crystal oscillator signal. With reference to FIG. 2, the error signal (corresponding to tune(v)) should lie somewhere in the middle of the tuning curve assuming that the synthesiser responds to the coarse tuning operation as expected (i.e. according to its design). If this is indeed the case, the varactor capacitances will be adjusted slightly and lock will be achieved. However, for a number of reasons (e.g. temperature effects) the error signal may not lie in the centre of the tuning curve and may approach the extremes of the curve.

After some predefined delay following the initial setting of the value in the register of the control logic, the control error at the input to the VCO is tested. The duration of this delay is programmable to allow the loop dynamics to be controlled.

The two reference signals generated by the reference voltage generator 7 are selected to define upper and lower boundaries for the error signal. Beyond these boundaries the tuning curve becomes non-linear. A first of the comparators 6a therefore checks whether the error signal exceeds the upper boundary. If so, the comparator 6a provides an "upper" switching signal to the control logic 2. The second of the comparators 6b checks whether the error signal is less than the lower boundary. If so, the comparator 6b provides a "lower" switching signal to the control logic 2. The control logic 2 responds to an upper switching signal by decrementing the value in the register so as to reduce the capacitance provided by the switchable capacitance elements in the VCO. This results in the coarse retuning of the VCO by one step to a higher frequency. Similarly, the control logic responds to a lower switching signal by incrementing the value in the register so as to increase the capacitance provided by the switchable capacitance elements in the VCO, thereby retuning the VCO to a lower frequency. This cycle of operation is repeated if necessary (following a further delay) to further coarse tune the VCO 1.

When lock is detected by the PLL 3, a lock signal is generated and provided to an input of the control logic 2. The control logic 2 responds to the lock signal by preventing further coarse tuning of the VCO. The system therefore remains stable until such time as a new value is written to the control processor register by the control processor.

Figure 7:
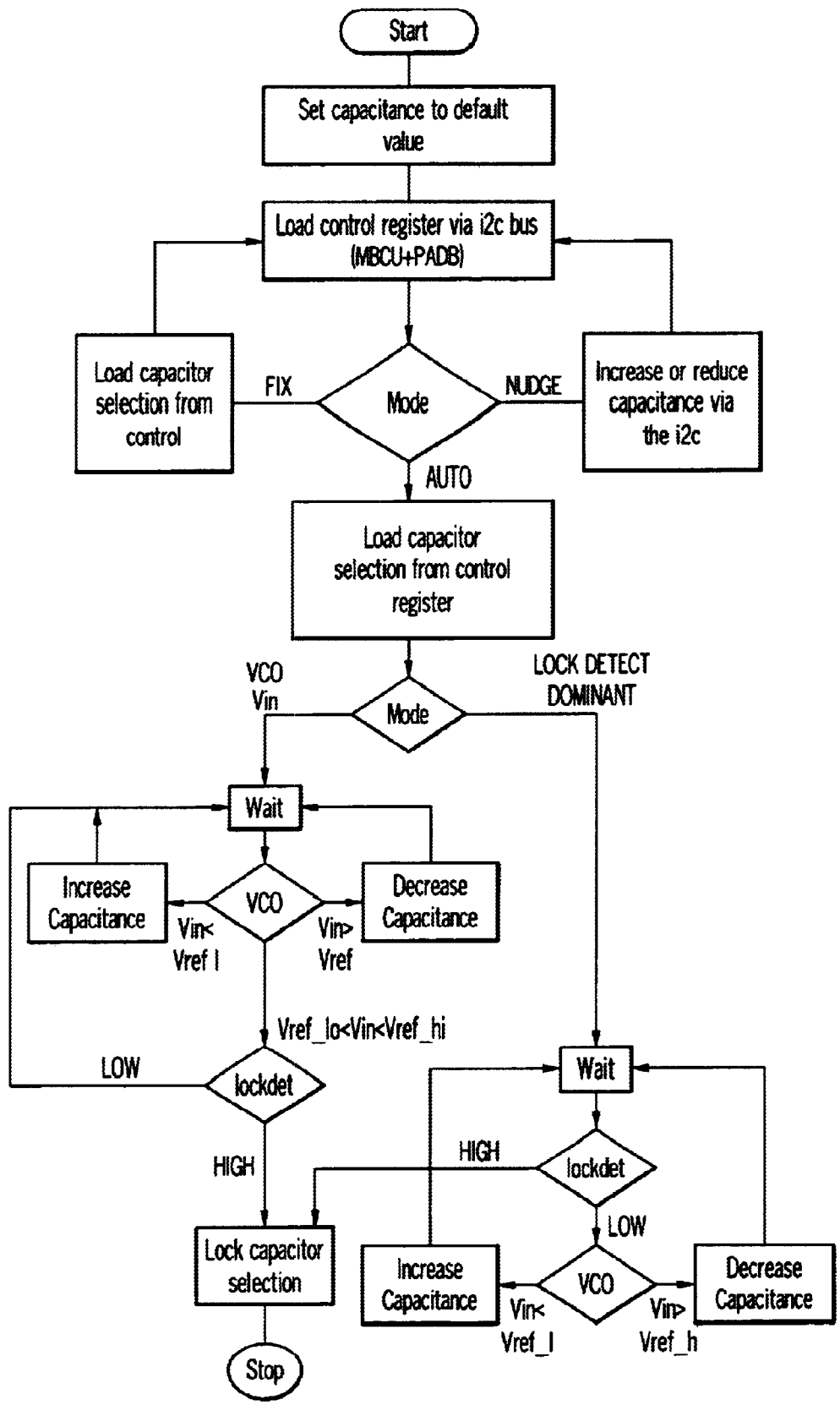
FIG. 7 is a flow diagram illustrating a mechanism for controlling a voltage controlled oscillator of a synthesiser according to FIG. 6.

The mechanism for controlling the VCO 1 of FIG. 6 is illustrated further by the flow diagram of FIG. 7. Additional operating modes which allow external control of the capacitor selection are shown in this flow diagram but are not relevant here.

It will be appreciated by the person of skill in the art that further modifications may be made to the above described embodiment without departing from the scope of the present invention.

What is claimed is:

1. A frequency synthesiser comprising:
   a voltage controlled oscillator, VCO, having means for fine tuning the oscillator frequency and switchable capacitive elements for coarse tuning the oscillator frequency;
   first comparison means for comparing the frequency and phase of the output of the VCO or a signal derived therefrom with that of a reference frequency signal to provide an error signal, the error signal being provided to said means for fine tuning the oscillator frequency;
   second comparison means for comparing the error signal against one or more reference values; and
   control means for receiving the result of the comparison from the second comparison means and for switching said switchable capacitive elements on and off in dependence upon the result so as to coarse tune the oscillator frequency.

2. A frequency synthesiser according to claim 1, wherein the means for fine tuning the VCO comprises a pair of varactors, and the varactors are each arranged to receive said error signal.

3. A frequency synthesiser according to claim 1, wherein said switchable capacitive elements for coarse tuning the oscillator frequency each comprise a capacitor coupled in series with a transistor switch.

4. A frequency synthesiser according to claim 3, wherein said control means comprises a register for storing values defining the settings of the switchable capacitive elements, and wherein the control means is arranged to change the values stored in the register in dependence upon the result of the comparison between the error signal and said one or more reference values.

5. A frequency synthesiser according to claim 1, wherein the frequency synthesiser comprises a low pass filter for filtering said error signal, and the low pass filtered error signal is provided to said first comparison means and to said means for fine tuning the oscillator frequency.

6. A frequency synthesiser according to claim 1, wherein said first comparison means is a phase locked loop, PLL.

7. A frequency synthesiser according to claim 1, wherein said one or more reference values includes a pair of reference values, and wherein said second comparison means is arranged to compare the error signal against a said pair of reference values corresponding to maximum and minimum error signal boundaries, said result indicating whether or not the error signal is greater than the maximum boundary, less than the minimum boundary, or between the maximum and minimum boundaries, and, in the event that said result indicates that the error is less than the minimum boundary, the control means will increase the capacitance in the switchable capacitive elements by switching on an additional capacitive element, and, in the event that said result indicates that the error is greater than the maximum boundary, the control means will decrease the capacitance in the VCO tuning circuit switchable capacitive element by switching off a capacitive element.

8. A frequency synthesiser according to claim 1, wherein said control means is arranged to act upon said result only after a predefined delay following the switching of one or more capacitive elements.

9. A frequency synthesiser according to claim 1, wherein said first comparison means comprises means for providing a lock signal at an output thereof, to indicate whether or not the frequency and phase of the output of the VCO is locked to that of the reference frequency signal or said derived signal, the lock signal being provided to said control means, and the control means being arranged to respond to an indication by the lock signal that lock has been achieved by inhibiting further switching of the switchable capacitive elements.

10. A method of controlling a voltage controlled oscillator, VCO, of a frequency synthesiser, the method comprising the steps of:
   comparing the output of the VCO or a signal derived therefrom against a reference frequency signal, and providing an error signal indicative of the frequency and phase difference between the two signals;
   applying the error signal to control fine tuning varactors of the VCO for fine tuning the oscillator frequency;
   comparing the error signal against one or more reference signals to provide a switching signal or signals; and
   using the switching signal(s) to control switchable capacitive elements for coarse tuning the oscillator frequency.

\* \* \* \* \*

UNITED STATES PATENT AND TRADEMARK OFFICE
CERTIFICATE OF CORRECTION

PATENT NO. : 6,683,509 B2
DATED : January 27, 2004
INVENTOR(S) : Richard Albon et al.

It is certified that error appears in the above-identified patent and that said Letters Patent is hereby corrected as shown below:

<u>Column 6,</u>
Line 16, delete "a" before the word "said".
Line 28, delete "VCO tuning circuit".

Signed and Sealed this

Sixth Day of April, 2004

JON W. DUDAS
*Acting Director of the United States Patent and Trademark Office*